(12) United States Patent
Harada

(10) Patent No.: US 8,294,517 B2
(45) Date of Patent: Oct. 23, 2012

(54) AMPLIFICATION CIRCUIT

(75) Inventor: Yasunari Harada, Ebina (JP)

(73) Assignee: Olympus Corporation, Tokyo (JP)

(*) Notice: Subject to any disclaimer, the term of this patent is extended or adjusted under 35 U.S.C. 154(b) by 0 days.

(21) Appl. No.: 13/087,591

(22) Filed: Apr. 15, 2011

(65) Prior Publication Data

US 2011/0254626 A1 Oct. 20, 2011

(30) Foreign Application Priority Data

Apr. 20, 2010 (JP) ................................. 2010-096933

(51) Int. Cl.
*H03F 3/45* (2006.01)
(52) U.S. Cl. ....................................... 330/261; 330/253
(58) Field of Classification Search .................. 330/253, 330/261
See application file for complete search history.

(56) References Cited

U.S. PATENT DOCUMENTS 7,348,849 B2 * 3/2008 Han et al. ....................... 330/261

OTHER PUBLICATIONS

Refet Firat Yazicioglu et al.; "A 200 µW Eight-Channel EEG Acquisition ASIC for Ambulatory EEG Systems", IEEE Journal Solid-State Circuits, Dec. 2008, pp. 3025-3028, vol. 43, No. 12.

* cited by examiner

*Primary Examiner* — Khanh V Nguyen
(74) *Attorney, Agent, or Firm* — Westerman, Hattori, Daniels & Adrian, LLP

(57) ABSTRACT

An amplification circuit may include an input differential pair including a first transistor receiving a positive input voltage and a second transistor receiving a negative input voltage, a first resistor that generates a difference current corresponding to a difference voltage between the positive input voltage and the negative input voltage, an output differential pair including a third transistor supplying a negative output voltage and a fourth transistor supplying a positive output voltage, a second resistor connected to a reference voltage to receive the difference current generated by the first resistor, and a bias circuit that supplies a bias current to the first transistor, the second transistor, the third transistor, and the fourth transistor. The first transistor, the second transistor, the third transistor, and the fourth transistor may have the same polarity.

4 Claims, 4 Drawing Sheets

FIG. 2

|  | TRANSISTOR M1 | TRANSISTOR M3 | UNIT |
|---|---|---|---|
| BIAS CURRENT (I) | 750 | 150 | nA |
| THRESHOLD VOLTAGE (Vth) | 0.8 | 0.8 | V |
| PRODUCT OF CARRIER MOBILITY AND CAPACITY PER UNIT AREA OF GATE OXIDE LAYER ($\beta$) | 50 | 50 | $uA/V^2$ |
| SIZE (W/L) | 1120/7 | 20/2.5 | um/um |

FIG. 4

| | TRANSISTOR M1 | TRANSISTOR M3 | TRANSISTOR M7 | TRANSISTOR M18 | TRANSISTOR M19 | UNIT |
|---|---|---|---|---|---|---|
| BIAS CURRENT (I) | 750 | 150 | 750 | 25 | 25 | nA |
| THRESHOLD VOLTAGE (Vth) | 0.8 | 0.6 | 0.8 | 0.8 | 0.8 | V |
| PRODUCT OF CARRIER MOBILITY AND CAPACITY PER UNIT AREA OF GATE OXIDE LAYER ($\beta$) | 50 | 100 | 50 | 50 | 50 | uA/V² |
| SIZE (W/L) | 1120/7 | 10/2.5 | 112/4 | 8/4 | 8/4 | um/um |

AMPLIFICATION CIRCUIT

BACKGROUND OF THE INVENTION

1. Field of the Invention

The present invention relates to an amplification circuit that amplifies an input signal.

Priority is claimed on Japanese Patent Application No. 2010-096933, filed Apr. 20, 2010, the content of which is incorporated herein by reference.

2. Description of the Related Art

All patents, patent applications, patent publications, scientific articles, and the like, which will hereinafter be cited or identified in the present application, will hereby be incorporated by reference in their entirety in order to describe more fully the state of the art to which the present invention pertains.

Conventionally, as a method of detecting output signals from various sensors and the like with high accuracy, an instrumentation amplifier is known. For example, an instrumentation amplifier has been disclosed in "Refet Firat Yazicioglu, A 200 uW Eight-Channel EEG Acquisition ASIC for Ambulatory EEG Systems, IEEE JOURNAL SOLID-STATE CIRCUITS, Vol. 43, No. 12, DECEMBER 2008, pp. 3025-3038". An instrumentation amplifier is required to amplify a difference voltage between input signals, remove common-mode voltages of the input signals, and achieve high input impedance.

Performance of removing the common-mode voltages of the input signals is defined as a common-mode rejection ratio. Thus, the common-mode rejection ratio is ideally infinite. However, the common-mode rejection ratio is limited to a finite value by an offset voltage of transistors of an input differential pair which constitutes the instrumentation amplifier. Therefore, it is impossible to equally control source-drain voltages of the transistors of the input differential pair, which are a factor of the offset voltage.

The configuration of the instrumentation amplifier, which is hereinafter referred to as an amplification circuit 200, disclosed in "Refet Firat Yazicioglu, A 200 uW Eight-Channel EEG Acquisition ASIC for Ambulatory EEG Systems, IEEE JOURNAL SOLID-STATE CIRCUITS, Vol. 43, No. 12, DECEMBER 2008, pp. 3025-3038" will be described. As shown in FIG. 3, the amplification circuit 200 includes an input differential pair including transistors M1 and M2, an output differential pair including a transistor M3 and a transistor M4, resistors R1 and R2, current conveyor circuits 101 and 102, level shift circuits 103 and 104, and transistors M5, M10, M15 and M16.

A positive input voltage $V_{INP}$ is supplied to a gate of the transistor M1 constituting the input differential pair. A negative input voltage $V_{INN}$ is supplied to a gate of the transistor M2 constituting the input differential pair. The resistor R1 is connected between a source of the transistor M1 and a source of the transistor M2 to generate a difference current $\Delta I$ corresponding to a difference voltage $\Delta V_{IN}$ between the positive input voltage $V_{INP}$ and the negative input voltage $V_{INN}$.

A drain of the transistor M3 constituting the output differential pair is connected between the source of the transistor M1 and one end of the resistor R1, and a negative output voltage $V_{OUTN}$ is supplied from a source of the transistor M3. A drain of the transistor M4 constituting the output differential pair is connected between the source of the transistor M2 and the other end of the resistor R1, and a positive output voltage $V_{OUTP}$ is supplied from a source of the transistor M4. Both ends of the resistor R2 are connected between the source of the transistor M3 and the source of the transistor M4, and the midpoint of the resistor R2 is connected to a reference voltage $V_{CM}$. The difference current $\Delta I$ generated in the resistor R1 is supplied to the resistor R2.

In addition, the polarity (according to the conductive type of a channel) of the transistors M1 and M2 constituting the input differential pair is different from that of the transistors M3 and M4 constituting the output differential pair. In detail, the transistors M1 and M2 are P type transistors and the transistors M3 and M4 are N type transistors.

The transistor M5 supplies a bias current to the transistor M1 and the transistor M3 based on a first reference voltage BIAS1. The transistor M10 supplies a bias current to the transistor M2 and the transistor M4 based on the first reference voltage BIAS1.

The current conveyor circuit 101 includes transistors M6 to M9 and controls the bias current supplied to the transistor M1 to a constant value based on a second reference voltage BIAS2. The current conveyor circuit 102 includes transistors M11 to M14 and controls the bias current supplied to the transistor M2 to a constant value based on the second reference voltage BIAS2. The transistors M15 and M16 control the sum of the currents supplied to the transistor M3 and the transistor M4 to a constant value based on the second reference voltage BIAS2.

The level shift circuit 103 includes transistors M17 to M19 and is connected between a gate of the transistor M3 and the current conveyor circuit 101 to ensure an operating voltage of the transistor M3. The level shift circuit 104 includes transistors M20 to M22 and is connected between a gate of the transistor M4 and the current conveyor circuit 102 to ensure an operating voltage of the transistor M4.

In addition, the resistor R2 includes a resistor R3 connected between the source of the transistor M3 and the reference voltage $V_{CM}$, and a resistor R4 connected between the source of the transistor M4 and the reference voltage $V_{CM}$. It is assumed that the resistor R3 and the resistor R4 have the same resistance value. Hereinafter, it is assumed that the resistance values of the resistor R1, the resistor R2, the resistor R3 and the resistor R4 are R1, R2, R3 and R4, respectively. Furthermore, in the amplification circuit 200, a positive supply voltage is defined as $V_{DD}$ and a negative supply voltage is defined as $V_{SS}$.

Next, the operation of the amplification circuit 200 will be described. In the amplification circuit 200, if the positive input voltage $V_{INP}$ is supplied to the gate of the transistor M1 and the negative input voltage $V_{INN}$ is supplied to the gate of the transistor M2, the difference voltage $\Delta V_{IN}$ between the positive input voltage $V_{INP}$ and the negative input voltage $V_{INN}$ is supplied to the resistor R1. The resistor R1 generates the difference current $\Delta I (=\Delta V_{IN}/R1)$ corresponding to the difference voltage $\Delta V_{IN}$ and the resistance value R1 of the resistor R1, thereby changing the values of the currents supplied from the transistor M5 and the transistor M10 to the transistor M3 and the transistor M4.

That is, the difference current $\Delta I$ is a part of the currents I which are normally supplied from the transistor M5 and the transistor M10 to the transistor M3 and the transistor M4. If the currents I that are supplied to the transistor M3 and the transistor M4 are defined as $I_3$ and $I_4$, the following Equations 1 to 3 are obtained.

When the positive input voltage $V_{INP}>$the negative input voltage $V_{INN}$, $$I_3 = I - \Delta I \quad I_4 = I + \Delta I \quad \Delta I \neq 0 \qquad (1)$$

When the positive input voltage $V_{INP}<$the negative input voltage $V_{INN}$, $$I_3 = I + \Delta I \quad I_4 = I - \Delta I \quad \Delta I \neq 0 \qquad (2)$$

When the positive input voltage $V_{INP}$=the negative input voltage $V_{INN}$, $$I_3 = I I_4 = I \Delta I = 0 \quad (3)$$

The currents I3 and I4 supplied to the transistor M3 and the transistor M4 are drawn into the transistor M15 and the transistor M16 supplying the same bias current. Therefore, the difference current ΔI generated when the positive input voltage $V_{INP}$>the negative input voltage $V_{INN}$ or the positive input voltage $V_{INP}$<the negative input voltage $V_{INN}$ is completely supplied to the resistor R2 having the midpoint connected to the reference voltage $V_{CM}$.

Here, if the difference voltage between the positive output voltage $V_{OUTP}$ and the negative output voltage $V_{OUTN}$ is defined as $\Delta V_{OUT}$, the following Equations 4 to 9 are obtained.

When the positive input voltage $V_{INP}$>the negative input voltage $V_{INN}$, $$V_{OUTP} = V_{CM} + \Delta I \times R4 \quad (4)$$
$$= V_{CM} + \frac{R4}{R1}\Delta V_{IN}$$
$$= V_{CM} + \frac{R2}{2 \times R1}\Delta V_{IN}$$

$$V_{OUTN} = V_{CM} - \Delta I \times R3 \quad (5)$$
$$= V_{CM} - \frac{R3}{R1}\Delta V_{In}$$
$$= V_{CM} - \frac{R2}{2 \times R1}\Delta V_{IN}$$

$$\Delta V_{OUT} = V_{OUTP} - V_{OUTN} \quad (6)$$
$$= \frac{R2}{R1}\Delta V_{IN}$$

When the positive input voltage $V_{INP}$<the negative input voltage $V_{INN}$, $$V_{OUTP} = V_{CM} - \Delta I \times R4 \quad (7)$$
$$= V_{CM} - \frac{R4}{R1}\Delta V_{IN}$$
$$= V_{CM} - \frac{R2}{2 \times R1}\Delta V_{IN}$$

$$V_{OUTN} = V_{CM} + \Delta I \times R3 \quad (8)$$
$$= V_{CM} + \frac{R3}{R1}\Delta V_{IN}$$
$$= V_{CM} + \frac{R2}{2 \times R1}\Delta V_{IN}$$

$$\Delta V_{OUT} = V_{OUTP} - V_{OUTN} \quad (9)$$
$$= -\frac{R2}{R1}\Delta V_{IN}$$

Consequently, the amplification circuit 200 can amplify the difference voltage ΔVIN between the positive input voltage $V_{INP}$ and the negative input voltage $V_{INN}$ according to the ratio of the resistances values of the resistor R1 and the resistor R2.

Next, the current conveyor circuit 101 will be described. When the source-drain voltage of the transistor M1 is defined as $V_{DS1}$, the source voltage of the transistor M1 is defined as $V_{S1}$, the drain voltage of the transistor M1 is defined as $V_{D1}$, and the gate-source voltage of the transistor M1 is defined as $V_{GS1}$, the current conveyor circuit 101 controls the source-drain voltage $V_{DS1}$ of the transistor M1 as expressed by Equation 10.

$$V_{DS1} = V_{S1} - V_{D1} = V_{INP} + V_{GS1} - (V_{INP} + V_{GS1} - V_{GS6} + V_{GS7}) = V_{GS6} - V_{GS7} \quad (10)$$

Likewise, when the source-drain voltage of the transistor M2 is defined as $V_{DS2}$, the source voltage of the transistor M2 is defined as $V_{S2}$, the drain voltage of the transistor M2 is defined as $V_{D2}$, and the gate-source voltage of the transistor M2 is defined as $V_{GS2}$, the current conveyor circuit 102 controls the source-drain voltage $V_{DS2}$ of the transistor M2 as expressed by Equation 11.

$$V_{DS2} = V_{S2} - V_{D2} = V_{INN} + V_{GS2} - (V_{INN} + V_{GS2} - V_{GS11} + V_{GS12}) = V_{GS11} - V_{GS12} \quad (11)$$

Consequently, the current conveyor circuits 101 and 102 can control the source-drain voltage $V_{DS1}$ of the transistor M1 and the source-drain voltage $V_{DS2}$ of the transistor M2 to constant values.

It is known that, in general, the common-mode rejection ratio of the amplification circuit is deteriorated when an offset voltage of an amplification circuit increases. The offset voltage (a difference voltage between a gate and a source of an input differential pair) of the amplification circuit is determined in proportion to element sizes if the element sizes and operation conditions (a source-drain voltage and a source-drain current) of the input differential pair constituting the amplification circuit are the same. When the operation conditions of the input differential pair are different from each other, the offset voltage is determined in proportion to the operation conditions.

As mentioned above, the common-mode rejection ratio is limited to a finite value by an offset voltage of transistors of an input differential pair. Therefore, it is essential to equally control the source-drain voltages and the source-drain currents of the transistors of the input differential pair, which are a factor of the offset voltage. In the amplification circuit 200, the source-drain voltage $V_{DS1}$ and the source-drain current $I_{DS1}$ of the transistor M1 and the source-drain voltage $V_{DS2}$ and the source-drain current $I_{DS2}$ of the transistor M2 can be controlled to constant values by the current conveyor circuits 101 and 102, respectively. Consequently, the offset voltages generated in the transistors M1 and M2 can be reduced, so that the common-mode rejection ratio of the amplification circuit 200 can be improved. Here, the source-drain voltage of the transistor is changed by the source-drain current. Therefore, in order to equally set the source-drain voltage of the transistors constituting the input differential pair, it is also necessary to equally set the source-drain current.

Next, the level shift circuit 103 will be described. When the maximum output voltage+of the amplification circuit 200 is defined as $V_{OUTMAX}$, the source-drain voltages of the transistor M1, the transistor M3 and the transistor M7 are defined as $V_{DS1}$, $V_{DS3}$ and $V_{DS7}$, and the gate-source voltages of the transistor M1, the transistor M3, the transistor M18 and the transistor M9 are defined as $V_{GS1}$, $V_{GS3}$, $V_{GS18}$ and $V_{GS19}$, the $V_{OUTMAX}$ is expressed by Equations 12 and 13.

$$V_{OUTMAX} = V_{INP} - V_{GS1} = V_{DS1} + V_{DS7} - V_{GS19} + V_{GS18} - V_{GS3} \quad (12)$$

$$V_{OUTMAX}' = V_{INP} + V_{GS1} - V_{DS3} \quad (13)$$

Here, as an example, when $V_{DD}$ is set to 3 V and $V_{INP}$ is set to ½$V_{DD}$, that is 1.5 V, with respect to Equations 12 and 13 and design parameters of the transistor M1, the transistor M3, the transistor M7, the transistor M18 and the transistor M19 are set as shown in FIG. 4, Equations 14 and 15 are obtained.

$$V_{OUTMAX} = V_{INP} + V_{th1} - \sqrt{\frac{2 \times I_7}{\beta \frac{W_7}{L_7}}} + V_{th19} + \sqrt{\frac{2 \times I_{19}}{\beta \frac{W_{19}}{L_{19}}}} + \quad (14)$$

$$V_{th18} + \sqrt{\frac{2 \times I_{18}}{\beta \frac{W_{18}}{L_{18}}}} - \left(V_{th3} + \sqrt{\frac{2 \times I_3}{\beta \frac{W_3}{L_3}}}\right) > V_{DD}$$

$$V'_{OUTMAX} = V_{INP} + V_{th1} - \sqrt{\frac{2 \times I_1}{\beta \frac{W_1}{L_1}}} - \sqrt{\frac{2 \times I_3}{\beta \frac{W_3}{L_3}}} = 2.28V \quad (15)$$

The $V_{OUTMAX}$ is determined by the smaller of the values calculated by Equations 14 and 15 above. Therefore, the $V_{OUTMAX}'$ calculated by Equation 15 is the maximum output voltage+of the amplification circuit 200. Meanwhile, if a common connection point between the drain of the transistor M7 and the drain of the transistor M9 in the current conveyor circuit 101 is directly connected to the gate of the transistor M3 without the level shift circuit 103, Equation 14 is changed to Equation 16.

$$V''_{OUTMAX} = V_{INP} + V_{th1} - \sqrt{\frac{2 \times I_7}{\beta \frac{W_7}{L_7}}} - \left(V_{th3} + \sqrt{\frac{2 \times I_3}{\beta \frac{W_3}{L_3}}}\right) \quad (16)$$

$$= 1.64V$$

By Equations 15 and 16, the level shift circuit 103 can increase the maximum output voltage+of the amplification circuit 200. In addition, although not described herein, the level shift circuit 104 can increase the maximum output voltage+of the amplification circuit 200 because it is equivalent to the level shift circuit 103.

SUMMARY

An amplification circuit may include an input differential pair including a first transistor receiving a positive input voltage through a gate thereof and a second transistor receiving a negative input voltage through a gate thereof, a first resistor that generates a difference current corresponding to a difference voltage between the positive input voltage and the negative input voltage, an output differential pair including a third transistor supplying a negative output voltage from a drain thereof and a fourth transistor supplying a positive output voltage from a drain thereof, a second resistor connected to a reference voltage to receive the difference current generated by the first resistor, and a bias circuit that supplies a bias current to the first transistor, the second transistor, the third transistor, and the fourth transistor. A source of the first transistor may be connected to a source of the third transistor, a source of the second transistor is connected to a source of the fourth transistor, a drain of the first transistor is connected to a gate of the third transistor, and a drain of the second transistor is connected to a gate of the fourth transistor. The first transistor, the second transistor, the third transistor, and the fourth transistor may have the same polarity.

The first resistor may be connected between the source of the first transistor and the source of the second transistor. The second resistor may be connected between the drain of the third transistor and the drain of the fourth transistor.

The bias circuit may include a fifth transistor that supplies the bias current to the first transistor and the third transistor, a sixth transistor that controls the bias current supplied to the first transistor to a constant value, a seventh transistor that supplies the bias current to the second transistor and the fourth transistor, an eighth transistor that controls the bias current supplied to the second transistor to a constant value, and a ninth transistor and a tenth transistor that control a sum of the bias current supplied to the third transistor and the fourth transistor to a constant value.

The first resistor may have the same type as the second resistor.

BRIEF DESCRIPTION OF THE DRAWINGS

The above features and advantages of the present invention will be more apparent from the following description of certain preferred embodiments taken in conjunction with the accompanying drawings, in which:

FIG. 2 is a reference diagram explaining the performance of an amplification circuit according to the first embodiment of the present invention;

FIG. 4 is a reference diagram explaining the performance of a conventional amplification circuit.

DETAILED DESCRIPTION OF THE PREFERRED EMBODIMENTS

The present invention will be now described herein with reference to illustrative embodiments. Those skilled in the art will recognize that many alternative embodiments can be accomplished using the teaching of the present invention and that the present invention is not limited to the embodiments illustrated for explanatory purpose.

Figure 1:
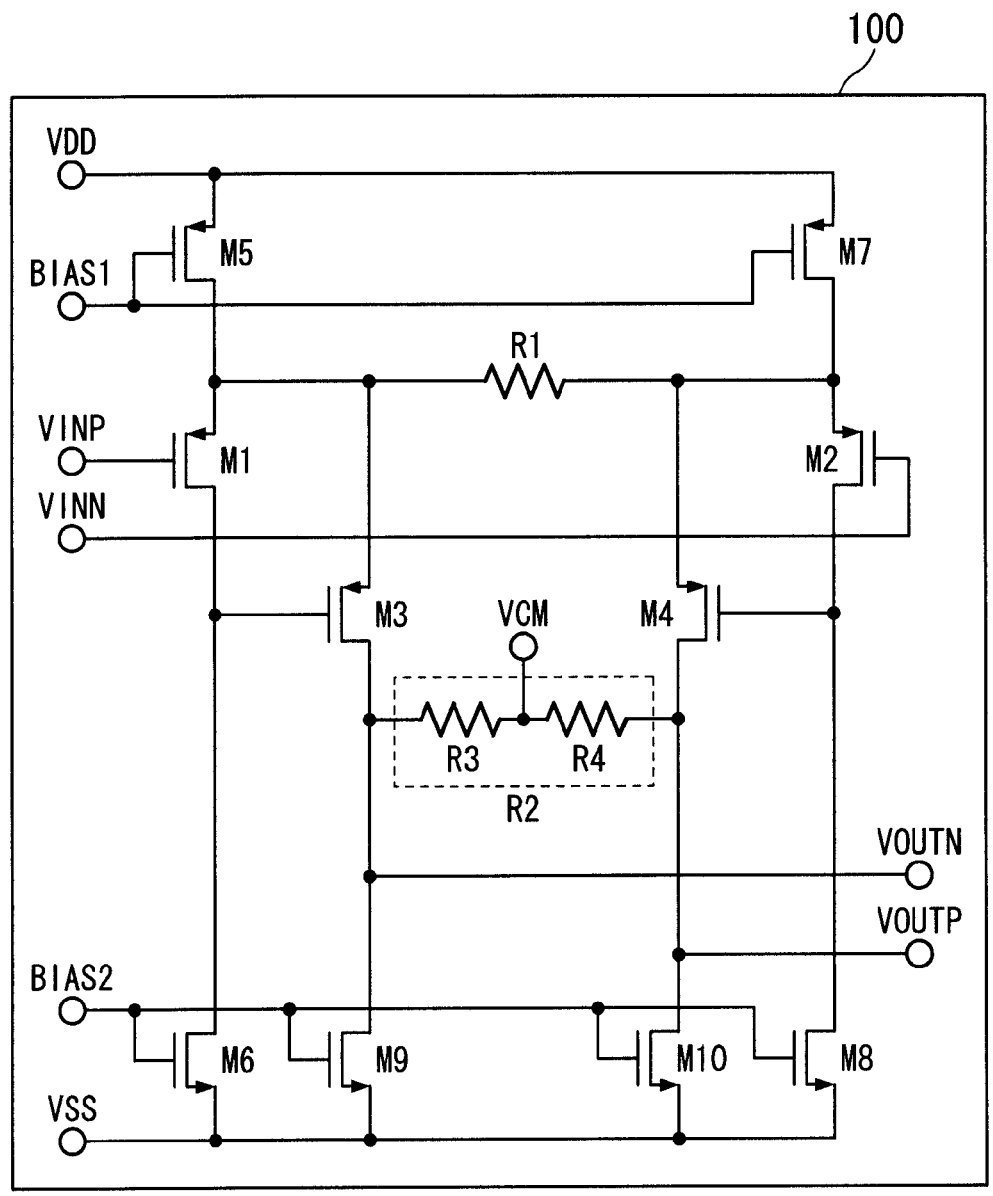
FIG. 1 is a circuit diagram showing the configuration of an amplification circuit according to a first embodiment of the present invention.
Figure 3:
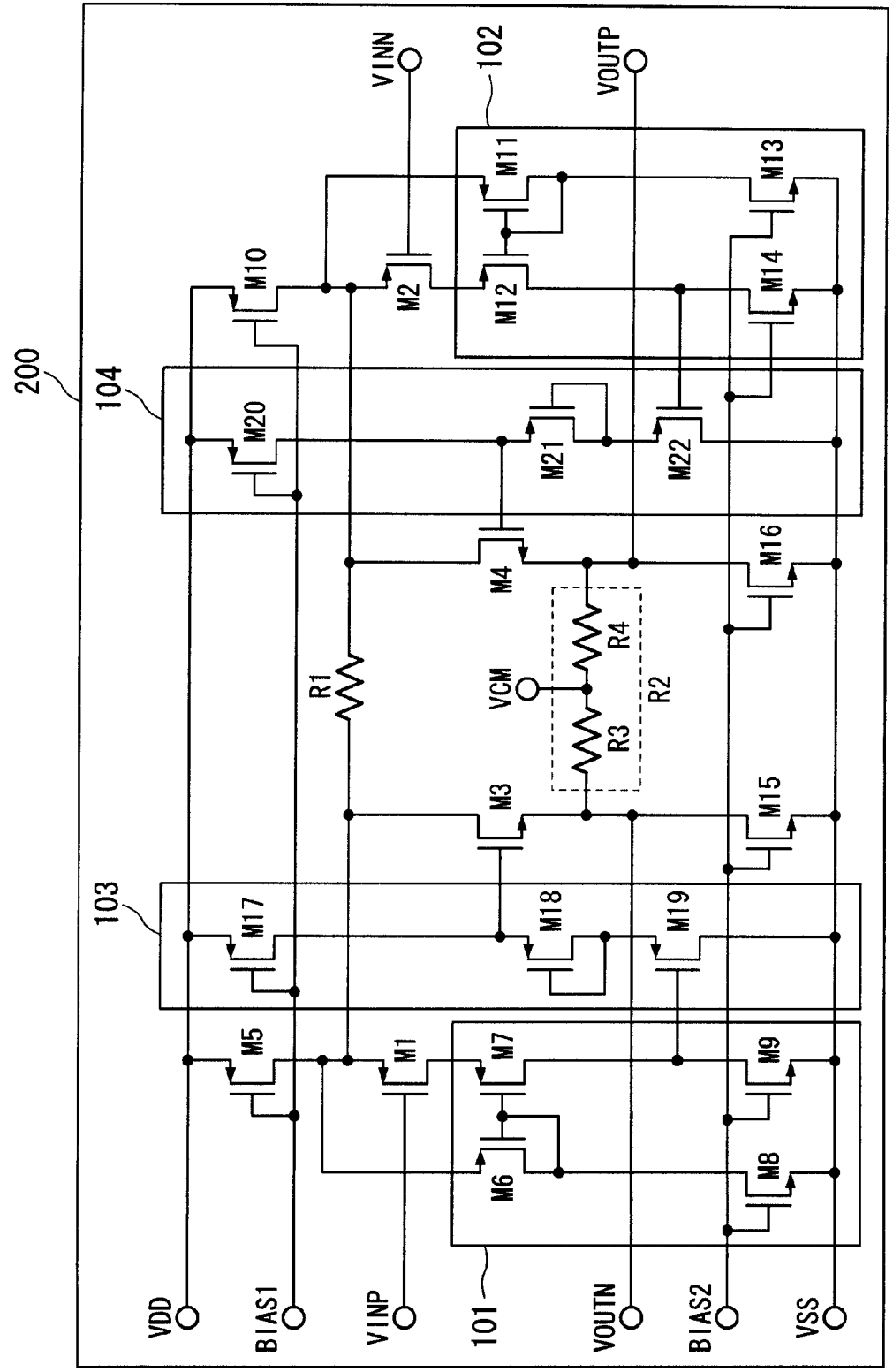
FIG. 3 is a circuit diagram showing the configuration of a conventional amplification circuit.

Hereinafter, an embodiment of the present invention will be described with reference to the accompanying drawings. FIG. 1 shows the configuration of an amplification circuit 100 according to a first embodiment of the present invention. As shown in FIG. 1, the amplification circuit 100 includes an input differential pair including transistors M1 and M2, an output differential pair including a transistor M3 and a transistor M4, resistors R1 and R2, and transistors M5 to M10.

A positive input voltage $V_{INP}$ is supplied to a gate of the transistor M1 (a first transistor) constituting the input differential pair. A negative input voltage $V_{INN}$ is supplied to a gate of the transistor M2 (a second transistor) constituting the input differential pair. The resistor R1 (a first resistor) is connected between a source of the transistor M1 and a source of the transistor M2 to generate a difference current $\Delta I$ corresponding to a difference voltage $\Delta V_{IN}$ between the positive input voltage $V_{INP}$ and the negative input voltage $V_{INN}$.

A source of the transistor M3 (a third transistor) constituting the output differential pair is connected between the source of the transistor M1 and one end of the resistor R1, and a negative output voltage $V_{OUTN}$ is supplied from a drain of the transistor M3. A source of the transistor M4 (a fourth transistor) constituting the output differential pair is connected between the source of the transistor M2 and the other end of the resistor R1, and a positive output voltage $V_{OUTP}$ is supplied from a drain of the transistor M4. Both ends of the resistor R2 (a second resistor) are connected between the drain of the transistor M3 and the drain of the transistor M4, and the midpoint of the resistor R2 is connected to a reference voltage $V_{CM}$. The difference current $\Delta I$ generated in the resistor R1 is supplied to the resistor R2.

The transistor M5 (a fifth transistor) supplies a bias current to the transistor M1 and the transistor M3 based on a first reference voltage BIAS1. The transistor M6 (a sixth transistor) controls the bias current supplied to the transistor M1 to a constant value based on a second reference voltage BIAS2. The transistor M7 (a seventh transistor) supplies a bias current to the transistor M2 and the transistor M4 based on the first reference voltage BIAS1. The transistor M8 (an eighth transistor) controls the bias current supplied to the transistor M2 to a constant value based on the second reference voltage BIAS2. The transistor M9 (a ninth transistor) and the transistor M10 (a tenth transistor) control the sum of the currents supplied to the transistor M3 and the transistor M4 to a constant value based on the second reference voltage BIAS2.

Furthermore, the drain of the transistor M1 is connected to the gate of the transistor M3, and the drain of the transistor M2 is connected to the gate of the transistor M4. In addition, the transistors M1 to M4 have the same polarity and the resistors R1 and R2 have the same type.

In addition, the resistor R2 includes a resistor R3 connected between the drain of the transistor M3 and the reference voltage $V_{CM}$, and a resistor R4 connected between the drain of the transistor M4 and the reference voltage $V_{CM}$. It is assumed that the resistor R3 and the resistor R4 have the same resistance value. Hereinafter, it is assumed that the resistance values of the resistor R1, the resistor R2, the resistor R3 and the resistor R4 are R1, R2, R3 and R4, respectively. Furthermore, in the amplification circuit 100, a positive supply voltage is defined as $V_{DD}$ and a negative supply voltage is defined as $V_{SS}$.

Next, the operation of the amplification circuit 100 will be described. In the amplification circuit 100, if the positive input voltage $V_{INP}$ is supplied to the gate of the transistor M1 and the negative input voltage $V_{INN}$ is supplied to the gate of the transistor M2, the difference voltage $\Delta V_{IN}$ between the positive input voltage $V_{INP}$ and the negative input voltage $V_{INN}$ is supplied to the resistor R1. The resistor R1 generates the difference current $\Delta I(=\Delta V_{IN}/R1)$ according to the difference voltage $\Delta V_{IN}$ and the resistance value R1 of the resistor R1, thereby changing the values of the currents supplied from the transistor M5 and the transistor M7 to the transistor M3 and the transistor M4.

That is, the difference current $\Delta I$ is a part of the currents I which are normally supplied from the transistor M5 and the transistor M7 to the transistor M3 and the transistor M4. If the currents I that are supplied to the transistor M3 and the transistor M4 are defined as $I_3$ and $I_4$, Equations 17 to 19 are obtained.

When the positive input voltage $V_{INP}$>the negative input voltage $V_{INN}$, $$I_3=I-\Delta I \quad I_4=I+\Delta I \quad \Delta I \neq 0 \tag{17}$$

When the positive input voltage $V_{INP}$<the negative input voltage $V_{INN}$, $$I_3=I+\Delta I \quad I_4=I-\Delta I \quad \Delta I \neq 0 \tag{18}$$

When the positive input voltage $V_{INP}$=the negative input voltage $V_{INN}$, $$I_3=I \quad I_4=I \quad \Delta I=0 \tag{19}$$

The currents $I_3$ and $I_4$ supplied to the transistor M3 and the transistor M4 are drawn into the transistor M9 and the transistor M10 supplying the same bias current. Therefore, the difference current $\Delta I$ generated when the positive input voltage $V_{INP}$>the negative input voltage $V_{INN}$ or the positive input voltage $V_{INP}$<the negative input voltage $V_{INN}$ is completely supplied to the resistor R2 having the midpoint connected to the reference voltage $V_{CM}$.

Here, if the difference voltage between the positive output voltage $V_{OUTP}$ and the negative output voltage $V_{OUTN}$ is defined as $\Delta V_{OUT}$, Equations 20 to 25 are obtained.

When the positive input voltage $V_{INP}$>the negative input voltage $V_{INN}$, Equations 20 to 25 are obtained.

$$\begin{aligned} V_{OUTP} &= V_{CM} + \Delta I \times R4 \\ &= V_{CM} + \frac{R4}{R1}\Delta V_{IN} \\ &= V_{CM} + \frac{R2}{2\times R1}\Delta V_{IN} \end{aligned} \tag{20}$$

$$\begin{aligned} V_{OUTN} &= V_{CM} - \Delta I \times R3 \\ &= V_{CM} - \frac{R3}{R1}\Delta V_{In} \\ &= V_{CM} - \frac{R2}{2\times R1}\Delta V_{IN} \end{aligned} \tag{21}$$

$$\begin{aligned} \Delta V_{OUT} &= V_{OUTP} - V_{OUTN} \\ &= \frac{R2}{R1}\Delta V_{IN} \end{aligned} \tag{22}$$

When the positive input voltage $V_{INP}$<the negative input voltage $V_{INN}$, $$\begin{aligned} V_{OUTP} &= V_{CM} - \Delta I \times R4 \\ &= V_{CM} - \frac{R4}{R1}\Delta V_{IN} \\ &= V_{CM} - \frac{R2}{2\times R1}\Delta V_{IN} \end{aligned} \tag{23}$$

$$\begin{aligned} V_{OUTN} &= V_{CM} + \Delta I \times R3 \\ &= V_{CM} + \frac{R3}{R1}\Delta V_{IN} \\ &= V_{CM} + \frac{R2}{2\times R1}\Delta V_{IN} \end{aligned} \tag{24}$$

$$\begin{aligned} \Delta V_{OUT} &= V_{OUTP} - V_{OUTN} \\ &= -\frac{R2}{R1}\Delta V_{IN} \end{aligned} \tag{25}$$

Consequently, the amplification circuit 100 can amplify the difference voltage $\Delta V_N$ between the positive input voltage $V_{INP}$ and the negative input voltage $V_{INN}$ according to the ratio of the resistance values of the resistor R1 and the resistor R2 including the resistor R3 and the resistor R4. Furthermore, the resistor R1 and the resistor R2 including the resistor R3 and the resistor R4 have the same type, so that the accuracy of an amplification factor can be increased.

Next, the source-drain voltage of the transistor M1 will be described. When the source-drain voltages of the transistor M1 and the transistor M3 are defined as $V_{DS1}$ and $V_{DS3}$, the source voltage of the transistor M1 is defined as $V_{S1}$, the drain voltage of the transistor M1 is defined as $V_{D1}$, and gate-source voltages of the transistor M1 and the transistor M3 are defined as $V_{GS1}$ and $V_{GS3}$. The source-drain voltage $V_{DS1}$ of the transistor M1 is controlled as expressed by Equation 26.

$$V_{DS1}=V_{S1}-V_{D1}=V_{INP}+V_{GS1}-(V_{INP}+V_{GS1}-V_{GS3})=V_{GS3} \tag{26}$$

Likewise, when the source-drain voltages of the transistor M2 and the transistor M4 are defined as $V_{DS2}$ and $V_{DS4}$, the source voltage of the transistor M2 is defined as $V_{S2}$, the drain voltage of the transistor M2 is defined as $V_{D2}$, and the gate-source voltages of the transistor M2 and the transistor M4 are defined as $V_{GS2}$ and $V_{GS4}$, the source-drain voltage $V_{DS2}$ of the transistor M2 is controlled as expressed by Equation 27.

$$V_{DS2} = V_{S2} - V_{D2} = V_{INN} + V_{GS2} - (V_{INN} + V_{GS2} - V_{GS4}) = V_{GS4} \quad (27)$$

Thus, if the source-drain currents supplied to the transistor M1 and the transistor M2 are equally set, the source-drain voltage $V_{DS1}$ of the transistor M1 and the source-drain voltage $V_{DS2}$ of the transistor M2 can be controlled to constant values without using the current conveyor circuit disclosed in the conventional art. Consequently, the offset voltages generated in the transistor M1 and the transistor M2 can be reduced, so that the common-mode rejection ratio of the amplification circuit 100 can be improved.

Next, the maximum output voltage+in the $V_{OUTN}$ of the amplification circuit 100 will be described. The maximum output voltage+in the $V_{OUTN}$ of the amplification circuit 100 is defined as $V_{OUTNMAX}$, the source-drain voltages of the transistor M1 and the transistor M3 are defined as $V_{DS1}$ and $V_{DS3}$, and the gate-source voltages of the transistor M1 and the transistor M3 are defined as $V_{GS1}$ and $V_{GS3}$. The $V_{OUTNMAX}$ is expressed by Equation 28.

$$V_{OUTNMAX} = V_{INP} + V_{GS1} - V_{DS3} \quad (28)$$

Here, as an example, when $V_{DD}$ is set to 3 V and $V_{INP}$ is set to $\frac{1}{2} V_{DD}$, that is 1.5 V with respect to Equation 28 and design parameters of the transistor M1 and the transistor M3 are set as shown in FIG. 2, Equation 29 is obtained.

$$V'_{OUTNMAX} = V_{INP} + V_{th1} + \sqrt{\frac{2 \times I_1}{\beta \frac{W_1}{L_1}}} - \sqrt{\frac{2 \times I_3}{\beta \frac{W_3}{L_3}}} \quad (29)$$

$$= 2.28 V$$

Consequently, the maximum output voltage+in the $V_{OUTN}$ of the amplification circuit 100 can be set to a high value without using the level shift circuit disclosed in the conventional art. Although not described herein, since the amplification circuit 100 has a bilaterally symmetric structure, the maximum output voltage+in the $V_{OUTP}$ of the amplification circuit 100 is equal to the maximum output voltage+in the $V_{OUTN}$.

As described above, according to the present embodiment, in the amplification circuit 100, the output differential pair including the transistors having the same polarity as that of the input differential pair is provided to the rear stage of the input differential pair, the source of the input differential pair is connected to the source of the output differential pair, and the drain of the input differential pair is connected to the drain of the output differential pair. Thus, the source-drain voltage of the input differential pair can be held to an approximately constant value. Consequently, the current consumption and circuit size can be reduced while improving the common-mode rejection ratio and the maximum output voltage.

In particular, the transistor M6 controlling the bias current supplied to the transistor M1 to a constant value and the transistor M8 controlling the bias current supplied to the transistor M2 to a constant value are provided. Thus, the source-drain voltage $V_{DS1}$ of the transistor M1 and the source-drain voltage $V_{DS2}$ of the transistor M2 can be controlled to constant values Consequently, the offset voltages generated in the transistor M1 and the transistor M2 can be reduced, so that the common-mode rejection ratio of the amplification circuit 100 can be improved.

Furthermore, while in the above description, the resistor R1 and the resistor R2 including the resistor R3 and the resistor R4 have the same type, the resistor R1 and the resistor R2 may have a different type. When the resistor R1 and the resistor R2 have the same type, it is possible to increase the accuracy of an amplification factor.

Furthermore, while in the above description, the midpoint of the resistor R2 including the resistor R3 and the resistor R4 is connected to the reference voltage $V_{CM}$, points other than the midpoint may be connected to the reference voltage $V_{CM}$.

As used herein, the following directional terms "forward, rearward, above, downward, right, left, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The term "configured" is used to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," "nearly", and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

The term "unit" is used to describe a component, section or part of a hardware and/or software that is constructed and/or programmed to carry out the desired function. Typical examples of the hardware may include, but are not limited to, a device and a circuit.

While preferred embodiments of the present invention have been described and illustrated above, it should be understood that these are examples of the present invention and are not to be considered as limiting. Additions, omissions, substitutions, and other modifications can be made without departing from the scope of the present invention. Accordingly, the invention is not to be considered as being limited by the foregoing description, and is only limited by the scope of the claims.

What is claimed is:

1. An amplification circuit comprising:
    an input differential pair including a first transistor receiving a positive input voltage through a gate thereof and a second transistor receiving a negative input voltage through a gate thereof;
    a first resistor that generates a difference current corresponding to a difference voltage between the positive input voltage and the negative input voltage;
    an output differential pair including a third transistor supplying a negative output voltage from a drain thereof and a fourth transistor supplying a positive output voltage from a drain thereof;
    a second resistor connected to a reference voltage to receive the difference current generated by the first resistor; and
    a bias circuit that supplies a bias current to the first transistor, the second transistor, the third transistor, and the fourth transistor, wherein a source of the first transistor is connected to a source of the third transistor, a source of the second transistor is connected to a source of the fourth transistor, a drain of the first transistor is connected to a gate of the third transistor, and a drain of the second transistor is connected to a gate of the fourth transistor, and the first transistor, the second transistor, the third transistor, and the fourth transistor have the same polarity.

2. The amplification circuit according to claim 1, wherein the first resistor is connected between the source of the first transistor and the source of the second transistor, and the second resistor is connected between the drain of the third transistor and the drain of the fourth transistor.

3. The amplification circuit according to claim 1, wherein the bias circuit comprises:
- a fifth transistor that supplies the bias current to the first transistor and the third transistor;
- a sixth transistor that controls the bias current supplied to the first transistor to a constant value;
- a seventh transistor that supplies the bias current to the second transistor and the fourth transistor;
- an eighth transistor that controls the bias current supplied to the second transistor to a constant value; and
- a ninth transistor and a tenth transistor that control a sum of the bias current supplied to the third transistor and the fourth transistor to a constant value.

4. The amplification circuit according to claim 1, wherein the first resistor has the same type as the second resistor.

* * * * *